(12) United States Patent
Lee (10) Patent No.: US 8,912,519 B2
(45) Date of Patent: Dec. 16, 2014

(54) VARIABLE RESISTIVE MEMORY DEVICE AND METHOD OF FABRICATING THE SAME

(71) Applicant: SK Hynix Inc., Gyeonggi-do (KR)

(72) Inventor: Keun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/766,578

(22) Filed: Feb. 13, 2013

(65) Prior Publication Data

US 2013/0221309 A1 Aug. 29, 2013

(30) Foreign Application Priority Data

Feb. 13, 2012 (KR) .................. 10-2012-0014536

(51) Int. Cl.
*H01L 29/02* (2006.01)
*H01L 47/00* (2006.01)
*H01L 45/00* (2006.01)
*H01L 27/24* (2006.01)

(52) U.S. Cl.
CPC .............. *H01L 45/06* (2013.01); *H01L 45/146* (2013.01); *H01L 45/143* (2013.01); *H01L 27/2481* (2013.01); *H01L 45/144* (2013.01); *H01L 45/1683* (2013.01); *H01L 45/085* (2013.01); *H01L 45/1233* (2013.01); *H01L 45/1608* (2013.01); *H01L 27/2409* (2013.01); *H01L 45/147* (2013.01); *H01L 45/1293* (2013.01)
USPC ................ 257/2; 257/1; 257/3; 257/E45.001; 438/57; 438/268; 438/382; 438/587

(58) Field of Classification Search
CPC .................................................. H01L 45/1608
USPC ................. 257/1–5, 368, E21.626, E21.004, 257/E45.001; 438/57, 268, 382, 624, 587, 438/299
See application file for complete search history.

(56) References Cited

U.S. PATENT DOCUMENTS

7,675,054 B2 3/2010 Tu
2011/0006279 A1 1/2011 Chen

*Primary Examiner* — Mark A Laurenzi
(74) *Attorney, Agent, or Firm* — IP & T Group LLP (57) ABSTRACT

Provided are a variable resistive memory device and a method of fabricating the same. The variable resistive memory device includes an interlayer insulating film having an opening therein, the opening exposing a surface of a first electrode which is disposed at a bottom of the opening. A variable resistive layer is formed in the opening and a second electrode is formed on the variable resistive layer. The variable resistive layer has a sidewall that is separated from an inner side surface of the opening to define a gap between the sidewall of the variable resistive layer and the inner side surface of the opening.

14 Claims, 9 Drawing Sheets

VARIABLE RESISTIVE MEMORY DEVICE AND METHOD OF FABRICATING THE SAME

CROSS-REFERENCE TO RELATED PATENT APPLICATION

This application claims the benefit of Korean Patent Application No. 10-2012-0014536, filed on Feb. 13, 2012, in the Korean Intellectual Property Office, the disclosure of which is incorporated herein in its entirety by reference.

BACKGROUND OF THE INVENTION

1. Field of the Invention

The present invention relates to a semiconductor technology, and more particularly, to a variable resistive memory device and a method of fabricating the same.

2. Description of the Related Art

As the demand for portable digital application devices, such as digital cameras, MP3 players, personal digital assistants (PDAs), or mobile phones has increased, the nonvolatile memory market has grown rapidly. High-density flash memory devices having low fabricating costs per bit are widely used as programmable nonvolatile memories. However, since flash memories require a relatively high capacity transistor in order to perform hot carrier injection for programming and a tunneling oxide film that is thick enough to endure a high internal voltage in order to ensure reliable data retention, there is a basic limitation in scaling down flash memories. As flash memories have recently reached their scaling limits, nonvolatile memory devices using a variable resistive material have attracted attention as alternative nonvolatile memories.

Since a variable resistive material has bi-stable resistive states that may be reversely changed by an electrical pulse applied thereto, and thus physical characteristics of the variable resistive material may be used as data, a memory device may operate without a transistor and may be easily scaled.

Regarding the scaling down of the variable resistive memory device, a driving device needs to be miniaturized, power consumption needs to be reduced. Especially, when a variable resistive material is a phase-change material, an interference due to thermal crosstalk between adjacent memory cells needs to be suppressed. In detail, when a phase-change memory device is designed to be equal to or less than 65 nm, particularly, equal to or less than 20 nm, heat generated during programming of a selected memory cell may affect a written state of another memory cell adjacent to the selected memory cell, thereby leading to reliability problems such as data loss or malfunction.

SUMMARY OF THE INVENTION

There is provided an exemplary variable resistive memory device including: an interlayer insulating film having an opening therein, the opening exposing a surface of a first electrode which is disposed at a bottom of the opening; a variable resistive layer formed in the opening; and a second electrode formed on the variable resistive layer, wherein a sidewall of the variable resistive layer is separated from an inner side surface of the opening to define a gap between the sidewall of the variable resistive layer and the inner side surface of the opening.

There is provided an exemplary method of fabricating a variable resistive memory device, the method including forming an interlayer insulating film, the interlayer insulating film having an opening therein, the opening exposing a surface of a first electrode which is disposed at a bottom of the opening; forming a sacrificial film on an inner side surface of the opening, the sacrificial film defining a groove through which a surface of the first electrode is exposed; filling the groove with a variable resistive material; forming a variable resistive layer by removing the variable resistive material film to expose the sacrificial film; removing the sacrificial film to form a gap between the inner side surface of the opening and a sidewall of the variable resistive layer; and forming a second electrode on the variable resistive layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

The invention may, however, be embodied in many different forms and should not be construed as being limited to the embodiments set forth herein; rather these embodiments are provided so that this disclosure will be thorough and complete, and will fully convey the concept of the invention to one of ordinary skill in the art.

In the drawings, the same reference numerals denote the same elements. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that when a substrate or layer is referred to as being "formed on," another substrate or layer, it can be directly or indirectly formed on the other substrate or layer. That is, for example, intervening substrates or layers may be present. Also, it will be understood by one of ordinary skill in the art that when an element is referred to as being "adjacent to" or "disposed adjacent to" another element, it may overlap with the other element or may be disposed under the other element.

In the description, relative terms such as "below," "above," "upper," "lower," "horizontal," and "vertical," should be construed to refer to the orientation as then described or as shown in the drawing under discussion. It wily be understood that these relative terms are intended to encompass different orientations of a device in use or operation in addition to the orientation depicted in the drawings.

The embodiments of the present invention will be explained with reference to cross-sectional views illustrating desired embodiments (and intermediate structures) of the present invention. In the drawings, sizes and shapes of members may be exaggerated for clarity and convenience, and modifications of the shapes may be made in reality. Accordingly, the embodiments of the present invention are not limited to specific shapes of regions illustrated in the specification. Also, reference numerals of members in the drawings denote the same members throughout.

The term "substrate" used herein includes a supporting structure such as silicon, silicon-on-insulator (SOI), or silicon-on-semiconductor (SOS), a semiconductor layer formed on a supporting structure other than a semiconductor, a doped or undoped semiconductor layer, and a modified semiconductor layer. Also, the terms "supporting structure" and "semiconductor" are not limited to a silicon-based material and collectively refer to carbon, a polymer, silicon-germanium, germanium, a group III-V semiconductor material such as a gallium-arsenic-based compound, a group II-VI semiconductor material, or a mixed semiconductor material.

Figure 1A:
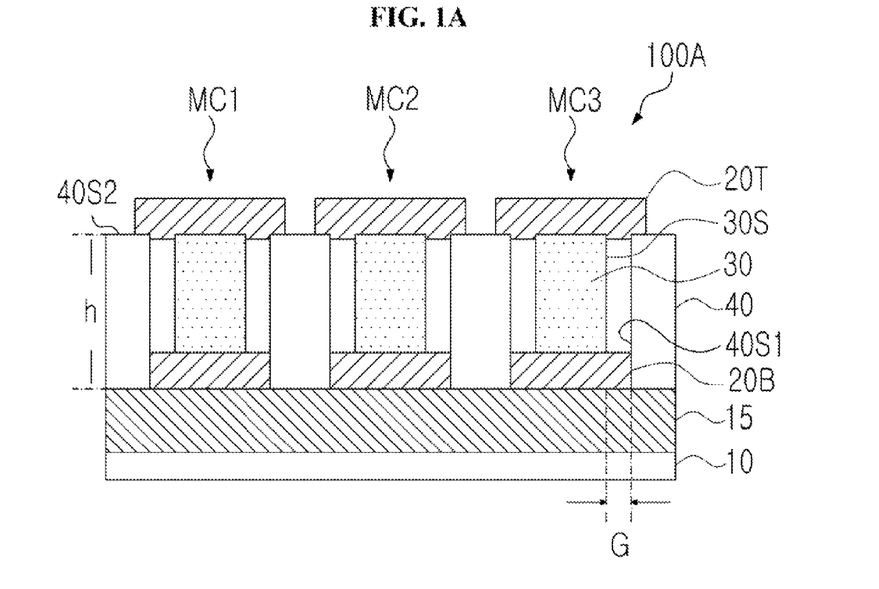
FIGS. 1A and 1B are cross-sectional views illustrating memory cells of variable resistive memory devices, according to an exemplary embodiment.
Figure 1B:
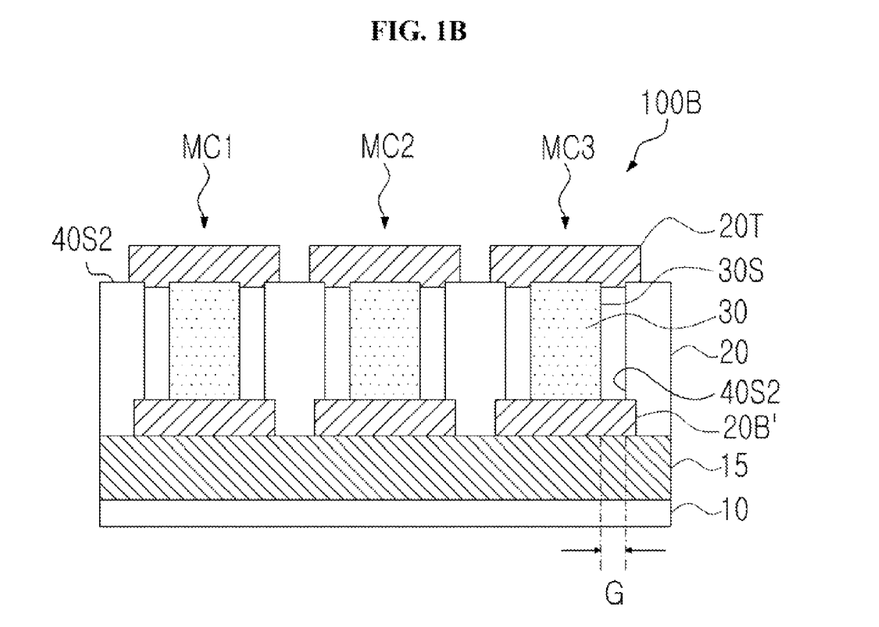

FIGS. 1A and 1B are cross-sectional views illustrating exemplary memory cells MC1, MC2, and MC3 of exemplary variable resistive memory devices 100A and 100B. FIGS. 1A and 1B illustrate only a portion of a cell array region. Circuit elements constituting a peripheral region (which will be explained below) adjacent to the cell array region may include, for example, a high voltage transistor, low voltage transistors, and wirings for electrically connecting the high voltage transistor and the low voltage transistors. Other known circuit elements may also be provided.

Referring to FIGS. 1A and 1B, each of the memory cells MC1, MC2, and MC3 are formed on a substrate 10 and may include a first electrode 20B, a second electrode 20T, and a variable resistive layer 30 for storing information between the first electrode 20B and the second electrode 20T. On the substrate 10 under the first electrode 20B, a circuit layer 15 may be formed, as will be explained below. The circuit layer 15 may include selection elements for selecting a cell, a wiring pattern layer (e.g., a word line or a bit line), an array of memory cells, or non-memory devices (e.g., a logic device).

The memory cells MC1, MC2, and MC3 may be electrically separated by an interlayer insulating film 40 from other adjacent memory cells. The interlayer insulating film 40 may have an opening (see OP of FIG. 2A), and at least one portion of the variable resistive layer 30 may be buried in the opening. Although the variable resistive layer 30 is entirely buried in the opening in all of the memory cells MC1, MC2, and MC3 of FIGS. 1A and 1B, the variable resistive layer is not limited to such an arrangement. For example, the variable resistive layer 30 may have a mushroom shape, wherein only a portion of the variable resistive layer 30 may be buried in the opening OP of the interlayer insulating film 40, while another portion of the variable resistive layer 30 may extend over the interlayer insulating film 40.

The variable resistive layer 30 may be formed of a phase-change material or a other variable resistive material. Preferably, the variable resistive layer 30 may be formed of a phase-change material. The phase-change material may reversibly change from an amorphous state to a crystalline state or vice versa, may have a resistance value that varies according to phase, and different resistance values may be allocated as data. For example, the phase-change material may have a high resistance in an amorphous state and may have a low resistance in a crystalline state. The phase-change material may include, for example, a GeSbTe-based material, such as $GeSb_2Te_3$, $Ge2Sb_2Te_4$, or $GeSb_2Te_4$, or a chalcogenide-based compound. Alternatively, examples of the phase-change material may include, but are not limited to, GeTeAs, GeSnTe, SeSnTe, GaSeTe, GeTeSnAu, SeSb2, InSe, GeTe, BiSeSb, PdTeGeSn, InSeTiCo, InSbTe, $In_3SbTe_2$, $GeTeSb_2$, $GeTe_3Sb$, GeSbTePd, or AgInSbTe. Also, a material obtained by adding an impurity element, for example, a non-metal element, such as boron (B), carbon (C), nitrogen (N), phosphorus (P), or oxygen (O), to the above materials may be used as the phase-change material.

The other variable resistive material is a material that may be reversibly changed between a low resistance state and a high resistance state based on an applied electrical signal. Examples of the variable resistive material may include a perovskite-based oxide, such as $PbTiO_3$, $PbZrO_3$, $Pb(Zr,Ti)O_3$, $SrTiO_3$, $SrZrO_3$, or $Nb:SrTiO_3$ or a transition metal oxide, such as $TiO_x$, NiO, $TaO_x$, $HfO_x$, $AlO_x$, $ZrO_x$, $CuO_x$, $NbO_x$, $TaO_x$, $GaO_x$, $GdO_x$, $MnO_x$, PrCaMnO, or $ZnONiO_x$. The perovskite-based oxide or the transition metal oxide may present a unipolar or a bipolar resistance switching behavior based on a polarity of an electrical pulse. Various mechanisms related to a conductive filament, an interface effect, or a trapped charge have been suggested to explain such a switching behaviour, but the mechanisms are not clear.

Since the variable resistive material has a hysteresis that can affect a current due to electrons in a microstructure suitable for a non-volatile memory, the variable resistive material may be used as a non-volatile information storing film. The hysteresis may have different characteristics based on types of unipolar resistive material and a bipolar resistive material. Alternatively, the variable resistive layer 30 may be formed of only a unipolar resistive material or only a bipolar resistive material. Alternatively, the variable resistive layer 30 may be designed to perform a multi-bit operation by including a stacked structure including a film of the unipolar resistive material and a film of the bipolar resistive material.

Alternatively, the variable resistive layer 30 may include a programmable metallization cell (PMC) material. In this case, the variable resistive layer 30 may include an electrolyte material having super ion regions. The PMC material may exhibit switching characteristics or change a resistance by physically rearranging the super ion regions in the electrolyte material. The electrolyte material having the super ion regions may be, for example, a base glass material, such as GeSe. The GeSe may be referred to as a chalcogenide glass or chalcogenide material. Examples of the GeSe may include $Ge_3Se_7$, $Ge_4Se_5$, or $Ge_2Se_3$. Alternatively, other known materials such as cadmium sulfide (CdS) may be used Each of the materials of the variable resistive layer 30 may have a single-layer structure or a staked structure. The stacked structure may be combined and connected in series or in parallel between the first and second electrodes 20B and 20T. The materials of the variable resistive layer 30 are exemplary and are not limited thereto. For example, the variable resistive layer 30 may include a polymer-based material or a polymer thin film including nanoscaled metal particles dispersed in a polymer-based material.

A surface of the first electrode 20B, in each of the memory cells MC1, MC2, and MC3 is exposed through the opening OP of the interlayer insulating film 30. As shown in FIG. 1A, the first electrode 20B may be integrally buried in the opening OP of the interlayer insulating film 30, and an entire surface of the first electrode 20B may be exposed through the opening OP before the variable resistive layer 30 is buried. Alternatively, as shown in FIG. 1B, a first electrode 20B' may be formed under the opening OP of the interlayer insulating film 30, and a surface of only a portion of the first electrode 20B' it may be exposed before the variable resistive layer 30 is buried.

A first electrode 20B or 20B' may be singulated for each of the memory cells MC1, MC2, and MC3 in FIGS. 1A and 1B. Alternatively, a first electrode 20B or 20B' may extend to other adjacent memory cells in a specific direction parallel to a bit line (or a word line), as will be explained below.

The first electrode 20B may be a single metal layer, or may have a stacked structure including, for example, a barrier layer, an adhesion layer, or an ohmic contact layer. The first electrode 20B may include, for example, aluminium (Al), platinum (Pt), tungsten (W) gold (Au), palladium (Pd), rhodium (Rh), iridium (Ir), ruthenium (Ru), tantalum (Ta), titanium (Ti), molybdenum (Mo), chromium (Cr), vanadium (V), a nitride thereof, an oxide thereof, or a combination thereof. The barrier layer may include, for example, titanium (Ti) titanium nitride, tantalum (Ta), tantalum nitride (TaN), or a combination thereof. Also, the adhesion layer may include, for example, titanium (Ti), titanium nitride (TiN), tantalum (Ta), tantalum nitride (TaN), tungsten nitride (WN), or a combination thereof. The above-listed materials of the first electrode 206 are only exemplary, and other materials may be used. Also, the first electrode 206 may include only the barrier layer, the adhesion layer, or the ohmic contact layer.

When the variable resistive layer 30 is formed of the PMC material, any one of the first electrode 20B or the second electrode 20T may be an anode and the other may be a cathode. In this case, the anode may include an electrochemically active metal, for example, a reactive metal that may be oxidized, such as silver (Ag), tellurium (Te), copper (Cu), nickel (Ni), or zinc (Zn). Also, the cathode may include a relatively non-active metal, such as W, Au, Pt, Pd, Rh, Ir, Ru, Ti, Ta, Mo, Cr, V, or a nitride (e.g., TiN), a silicide (e.g., TiSi), or a combination thereof.

The interlayer insulating film 40 may include an inner side surface 40S1 of the opening and an outer surface 40S2 defining the opening OP. A side wall 30S of the variable resistive layer 30 may define a gap G by being separated or recessed from the inner side surface 40S1 of the opening OP. The interlayer insulating film 40 may be formed of an insulating material, such as a silicon oxide film or a silicon nitride film. The gap G may be vaccumized. Alternatively, the gap G may be filled with oxygen, nitrogen, an inert gas, or a mixture thereof during a process of forming the gap G and a subsequent process of forming an atmosphere or artificially injecting a gas into the gap G.

According to an exemplary embodiment, a width of the variable resistive layer 30 in the opening OP may be reduced due to the gap G. Accordingly, a programming region of the variable resistive layer 30 may be formed to have a value equal to or less than a critical dimension (CD) of photolithography, thereby increasing a driving speed and reducing power consumption.

Also, since the width of the variable resistive layer 30 is reduced due to the gap G, a contact area between the first electrode 20B and the variable resistive layer 30 may be reduced. As a result, when the variable resistive layer 30 is formed of a phase-change material, an effective current density for programming a cell is increased, thereby making driving elements miniaturized and further increasing a density of integration. Also when the gap G is evacuated or is filled with an appropriate gas, a thermal conductivity of the gap G may be lower than a thermal conductivity of the interlayer insulating film 40 which is a solid state film. For example, while an interlayer insulating fill formed of a silicon oxide film has a thermal conductivity of 1.3 W/mK and an interlayer insulating film formed of a silicon nitride film has a thermal conductivity of 9.2 W/mK, air may have a thermal conductivity of 0.025 W/mK, which is equal to or less than 1/10 of the thermal conductivity of the interlayer insulating film. Accordingly, thermal interference in which heat generated during programming of a selected memory cell is transferred to an adjacent unselected memory cell and the adjacent unselected memory cell is also programmed may be reduced or prevented.

The second electrode 20T may extend to be disposed over the outer surface 40S2 of the interlayer insulating film 40, as shown in FIGS. 1A and 1B. In this case, the gap G may be closed by the second electrode 20T. The second electrode 20T is formed on the variable resistive layer 30. As shown in FIGS. 1A and 1B, a second electrode 20T may be formed for each of the memory cells MC1, MC2, and MC3, or the second electrode 20T may extend to other adjacent memory cells in a direction parallel to a bit line (or a word line) formed on the second electrode 20T, as described above with respect to the first electrode 20B or 20B'. Alternatively, the second electrode 20T may be locally formed only on the variable resistive layer 30.

The second electrode 20T may be a single metal layer, or may have a stacked structure further including a barrier layer, an adhesion layer, or an ohmic contact layer (e.g., the first electrode 20B or 20B'). For example, the second electrode 20T may include Al, Pt, W, Au, Pd, Rh, Ir, Ru, Ta, Mo, Cr, V, a nitride thereof, an oxide thereof, or a combination thereof, like the first electrode 20B. Also, if the second electrode 20T has the stacked structure, the barrier layer may include, for example, Ti, TiN, or a nitride thereof, or a combination thereof. Also, the adhesion layer may include, for example, Ti, Ti nitride, Ta, Ta nitride, W nitride, or a combination thereof. The materials of the second electrode 20T are exemplary, and are not limited to the materials set forth above. For example, other well-known materials may be used. Alternatively, the second electrode 20T may include a single metal layer such as barrier layer, an adhesion layer, or an ohmic contact layer.

FIGS. 2A through 2G are cross-sectional views illustrating an exemplary method of fabricating memory cells of a variable resistive memory device. The following explanation will generally focus on the variable resistive memory device 100A including the memory cells MC14, MC2, and MC3 of FIG. 1A, and for elements denoted by the same reference numerals as those in FIG. 1A, the previous explanation may be referred to unless contradicted.

Figure 2A:
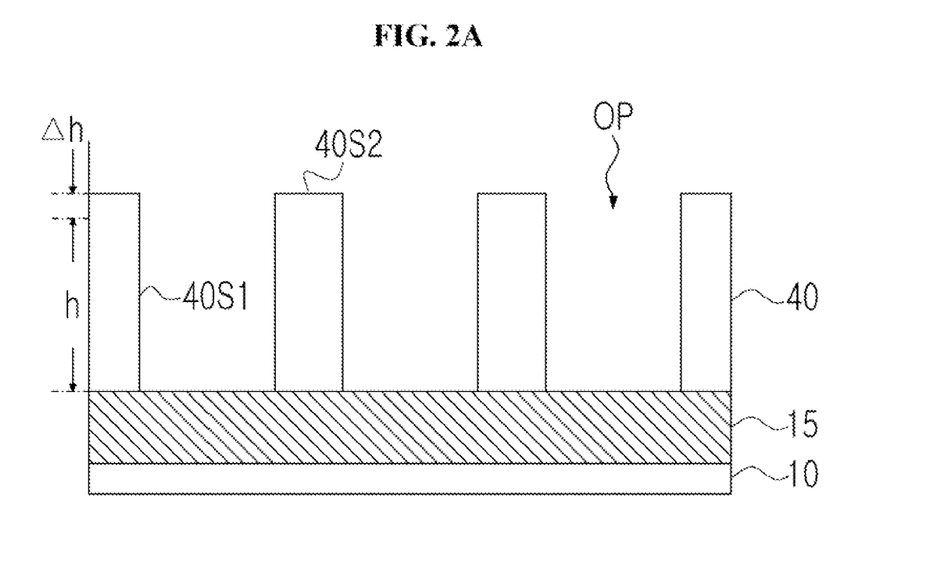
FIGS. 2A through 2G are cross-sectional views illustrating an exemplary method of fabricating memory cells of a variable resistive memory device.

Referring to FIG. 2A, the substrate 10 on which the circuit layer 15 is formed on the substrate 10. The interlayer insulating film 40 is formed on the substrate 10 using, for example, plasma-enhanced chemical vapor deposition. The opening OP is formed in the interlayer insulating film 40 by patterning. Accordingly, the interlayer insulating film 40 includes the inner surface 40S1 of the opening OP and the outer surface 40S2 defining the opening OP. A height of the interlayer insulating film 40 may be higher by $\Delta h$ than a cell height "h" of each of the memory cells MC1, MC2, and MC3 of FIG. 1A. The interlayer insulating film 40, whose height is higher by Δh than the cell height "h," may be planarized to have a height equal to the cell height "h," as shown in FIGS. 2A and 2E.

Figure 2B:
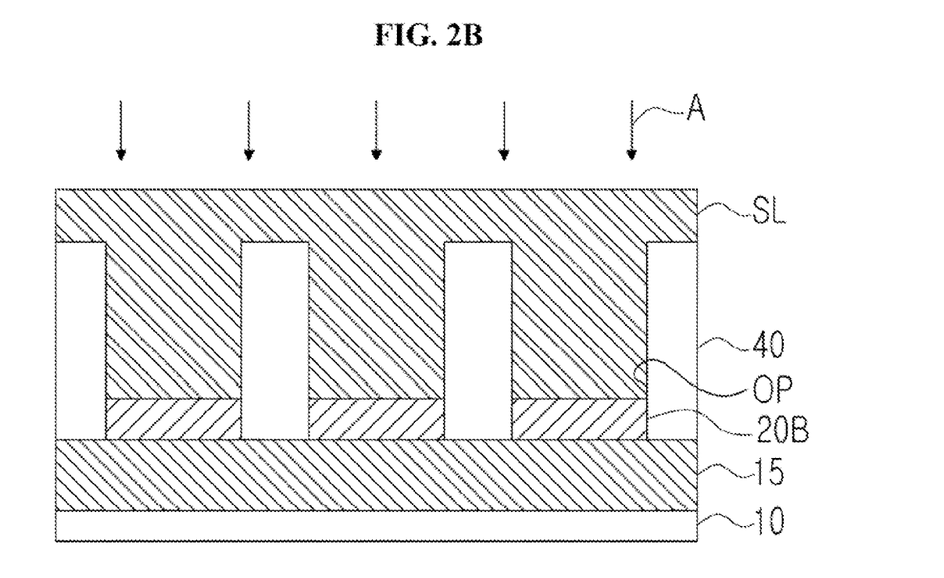

Referring to FIG. 2B, the first electrode 20B is formed in the opening OP of the interlayer insulating film 40. The first electrode 20B may be formed by filling the opening OP with an electrode material by using physical vapor deposition or chemical vapor deposition, and then by recessing the electrode material to a predetermined thickness using etchback. Alternatively, the first electrode 208 may be locally formed in the opening OP by using a chemical reaction, such as silicidation.

After the first electrode 20B is formed, a sacrificial material layer SL is formed on the interlayer insulating film 40 to fill the opening OP. The sacrificial material layer SL may be an insulating film formed by using plasma chemical vapor deposition having excellent gap-fill characteristics. The sacrificial material layer SL may be formed of a material selected from materials having a high etch selectivity with respect to the interlayer insulating film 40. For example, when the interlayer insulating film 40 is a silicon oxide film, the sacrificial material layer SL may be a silicon nitride film or a silicon oxynitride film. In contrast, when the interlayer insulating film 40 is a silicon nitride film or a silicon oxynitride film, the sacrificial material layer SL may be a silicon oxide film. The materials of the interlayer insulating film 40 and the sacrificial material layer SL are exemplary, and any one of the interlayer insulating film 40 and the sacrificial material layer SL may be formed of a silicon based material and the other may be formed of a non-silicon-based material. Alternatively, even though the interlayer insulating film 40 and the sacrificial material layer SL are formed of the same material, an etch selectivity may be increased by changing physical and chemical properties by doping an impurity.

Figure 2C:
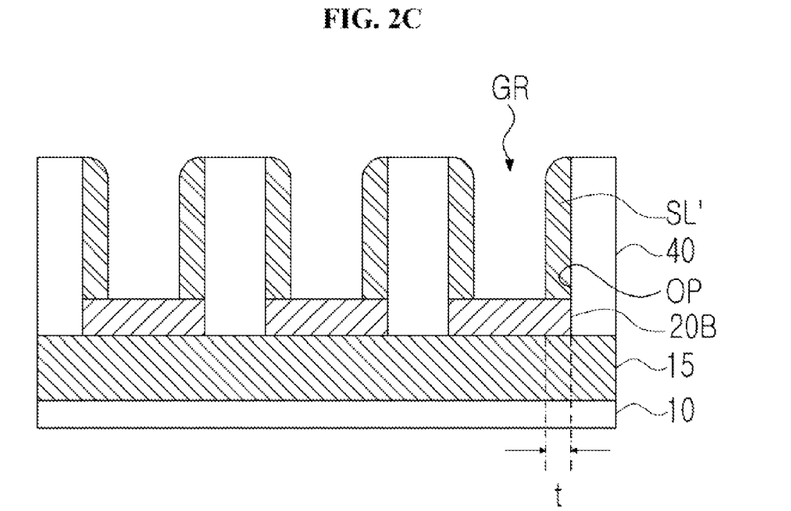

Subsequently, a sacrificial film SL' having a spacer shape (as shown in FIG. 2C) may be formed by performing anisotropic etching, such as plasma etching, as marked by arrows A on the sacrificial material layer SL, The sacrificial film SL' may conformally coat the inner surface 40S1 of the interlayer insulating film 40 to have a thickness "t." A groove GR may be defined in the opening OP by the sacrificial film SL'. A surface of a portion of the first electrode 20B may be exposed through the groove GR.

Figure 2D:
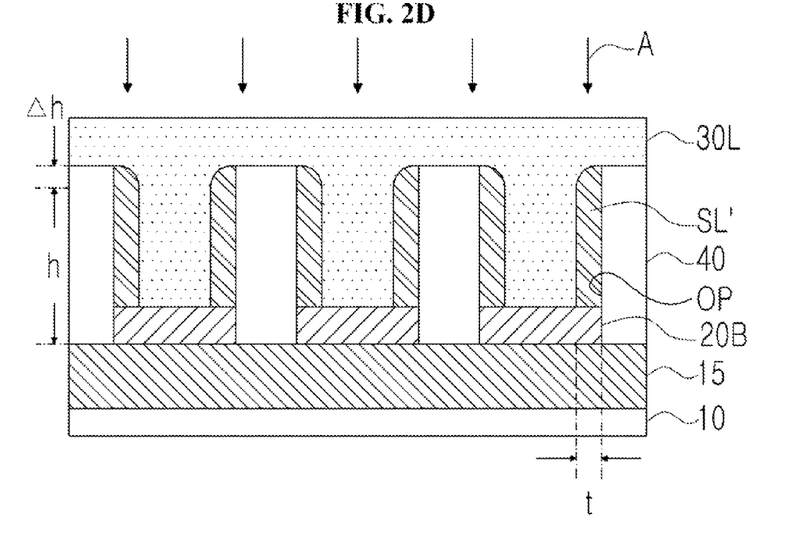
Figure 2E:
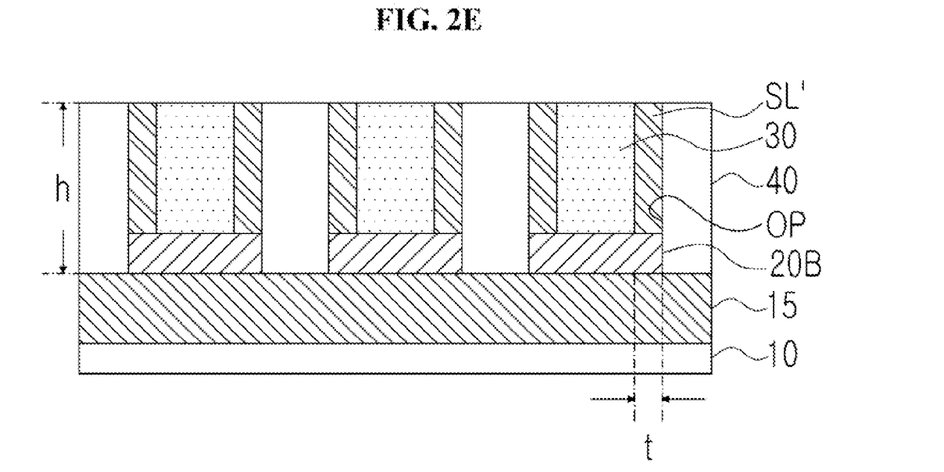

Referring to FIG. 2D, a variable resistive material film 30L, which is to be the variable resistive layer 30, is formed on the interlayer insulating film 40 to fill the groove GR. Next, a portion of the variable resistive material film 30L may be removed to expose the sacrificial film SL'. For example, as shown in FIG. 2D, until a portion of the sacrificial film SL' is exposed, planarization using chemical mechanical polishing or etch-back using plasma etching, which partially removes the variable resistive material film 30L, may be performed. The planarization and the etch-back may be performed until the outer surface 40S2 of the interlayer insulating film 40 is exposed or until the interlayer insulating film 40 is over-etched to an extent of a depth Δh. As a result, as shown in FIG. 2E, the sacrificial film SL' may be exposed. Individual cell may be electrically defined by using such a planarization or etchback.

Figure 2F:
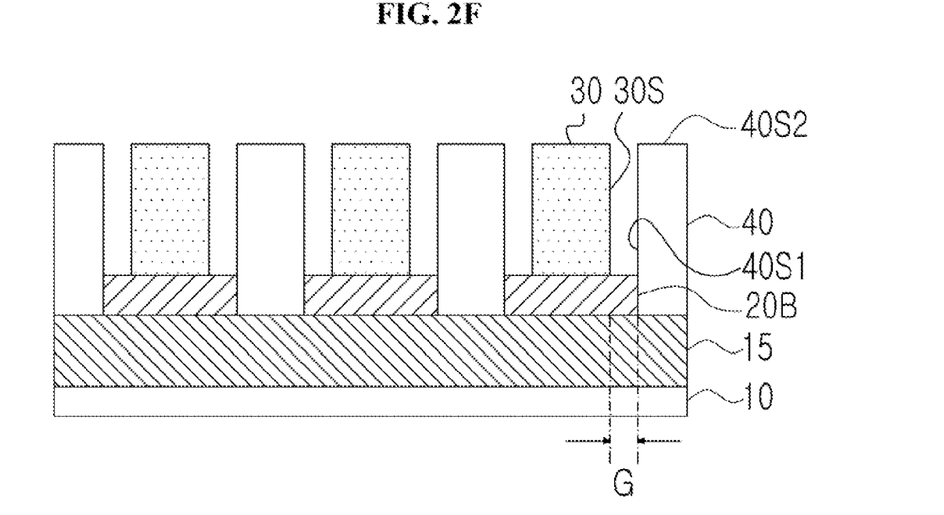

Referring to FIG. 2F, at least one portion of the sacrificial film SL' is removed to form the gap G between the inner surface 40S1 of the interlayer insulating film 40 and the side wall 30S of the variable resistive layer 30. The sacrificial film SL' may be removed by using wet etching. For example, when the sacrificial film SL' is formed of silicon nitride, the sacrificial film SL' may be removed using phosphoric acid ($H_3PO_4$). Accordingly, the gap G may be defined between the inner surface 40S1 of the opening OP and the side wall 30S of the variable resistive layer 30. A width of the gap G is equal to the thickness "t" of the sacrificial film SL'.

According to an exemplary embodiment, a width of the variable resistive layer 30 in the opening OP may be reduced due to the gap G. Accordingly, a programming region of the variable resistive layer 30 may be formed to have a value equal to or less than a critical dimension of photolithography thereby increasing a driving speed and reducing power consumption. Also, since the width of the variable resistive layer 30 is reduced due to the gap G, a contact area between the first electrode 20B and the variable resistive layer 30 may be reduced. As a result, if the variable resistive layer 30 is formed of a phase-change material, then an effective programming current density for Joule heating (which depends on a contact area) is increased, thereby making driving elements compact and further increasing a density of integration.

Figure 2G:
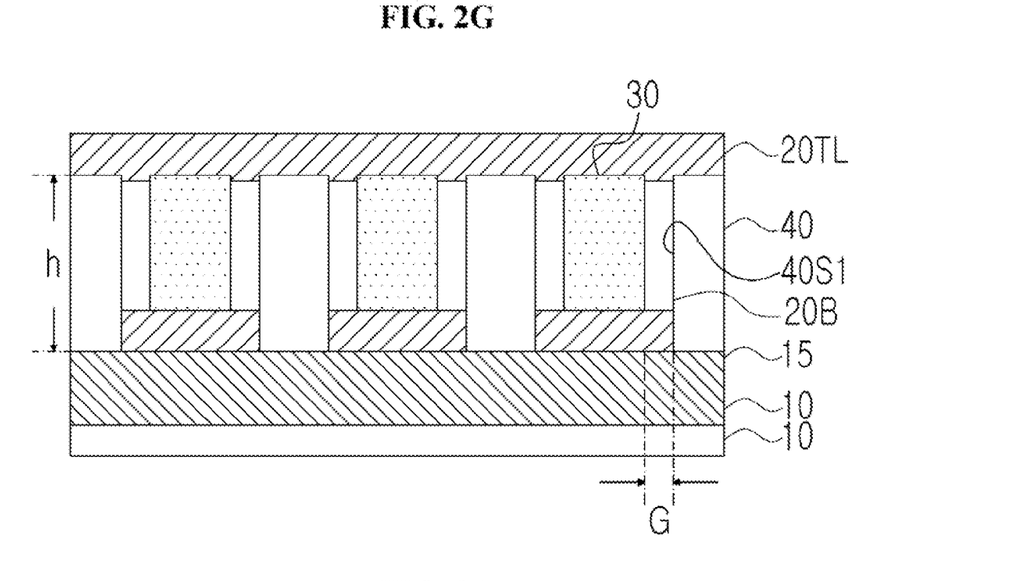

Referring to FIG. 2G, the second electrode 20T (see FIG. 1A) is formed on the variable resistive layer 30. To this end, a metal layer 20TL, which is to be the second electrode 20T, may be formed on the outer surface 40S2 of the interlayer insulating film 40 and a top surface of the variable resistive layer 30.

The metal layer 20TL may be formed by using physical vapor deposition, which may be adjusted not to cover a stepped portion. The physical vapor deposition may be performed by using, for example, sputtering, electron beam ablation, arc deposition, or a combination thereof. As a result, the metal layer 20TL may be disposed over the outer surface 40S2 of the interlayer insulating film 40 and the variable resistive layer 30 while closing the gap G without substantially flowing into and filling the gap G.

Next, the second electrode 20T may be formed by patterning the metal layer 20TL. The second electrode 20T may be patterned for each of the memory cells MC1, MC2, and MC3, or may be patterned to extend to other memory cells that are adjacent in a predetermined direction while being coupled to a bit line (or a word line) which will be explained below.

Figure 3A:
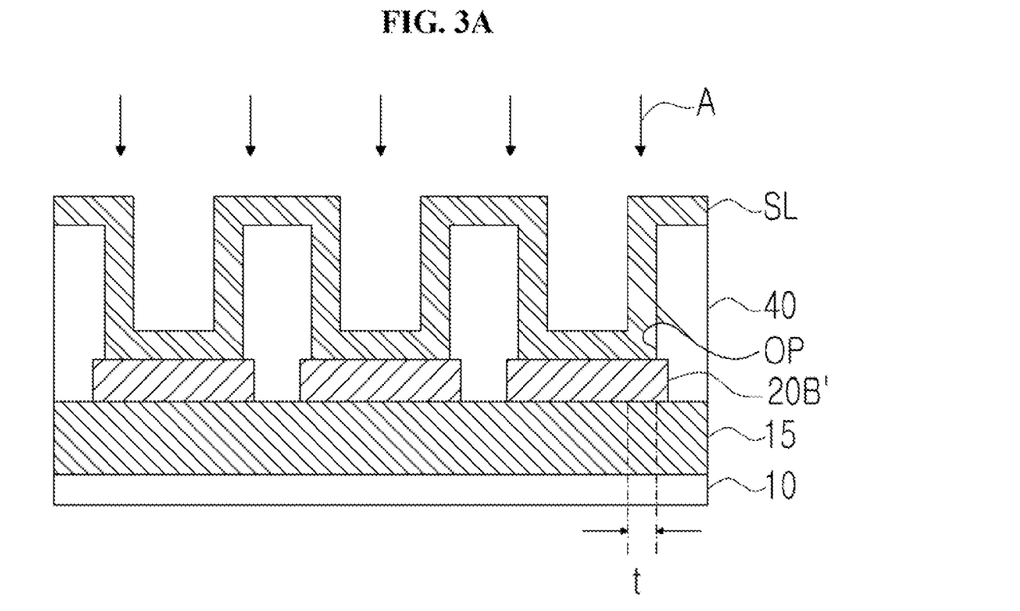
FIGS. 3A through 3C are cross-sectional views illustrating an exemplary method of fabricating memory cells of a variable resistive memory device.
Figure 3B:
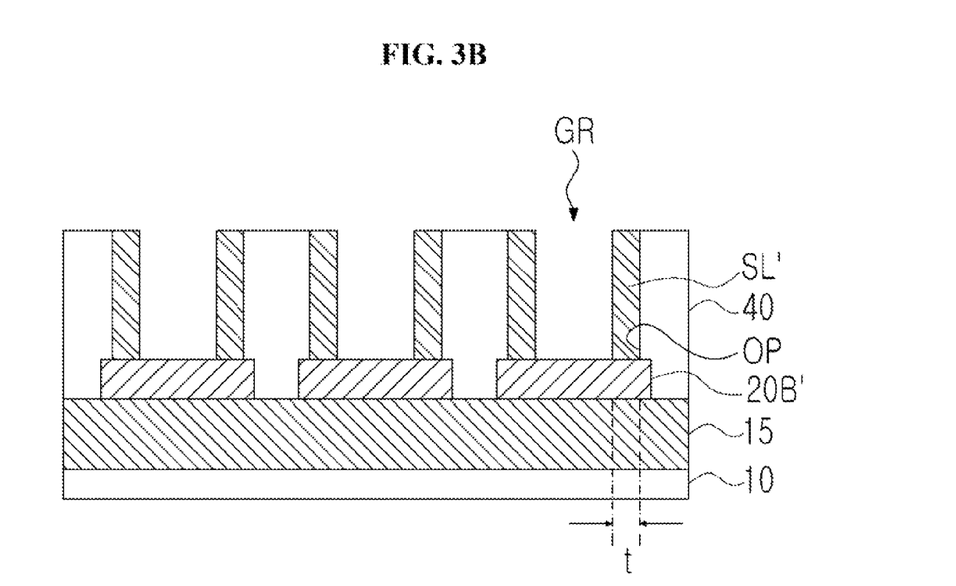
Figure 3C:
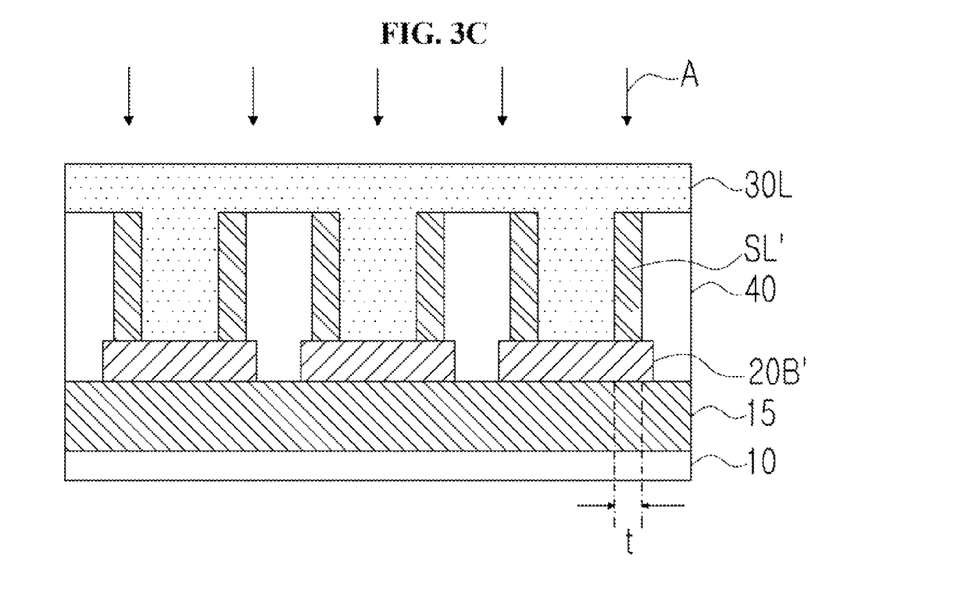

FIGS. 3A through 3C are cross-sectional views sequentially illustrating an exemplary method of fabricating memory cells of a variable resistive memory device. The following explanation will focus on the variable resistive memory device 100B including the memory cells MC1, MC2, and MC3 of FIG. 1B, and for elements denoted by the same reference numerals as used above, the previous explanation may be referred to unless contradicted.

Referring to FIG. 3A, the substrate 10 on which the circuit layer 15 is formed may be prepared. The first electrode 20B' of FIG. 3A may not be integrally buried in the opening OP of the interlayer insulating film 40 and may be formed before the interlayer insulating film 40 is formed, and only a surface of a portion of the first electrode 20B' may be exposed through the opening OP.

To this end, after an electrode layer, which will become the first electrode 20B', is formed on the substrate 10, the electrode layer is patterned. The first electrode 20B' may be patterned for each of the memory cells MC1, MC2, and MC3, or may be patterned to extend to memory cells that are adjacent in a predetermined direction by being coupled to a word line (or a bit line) disposed under the first electrode 20B'. Next, after the interlayer insulating film 40 is formed on the substrate 10 on which the first electrode 20B' is formed, a surface of the first electrode 20B' may be exposed by forming the opening OP in the interlayer insulating film 40 by using photolithography or etching.

Subsequently, the sacrificial material film SL may be conformally formed to a substantially uniform thickness on a side wall or a bottom of the opening OP of the interlayer insulating film 40. The sacrificial material film SL may be obtained by using chemical vapor deposition or atomic layer deposition, which may form a conformal film. The sacrificial material film SL may be deposited to have the thickness "t."

Next, anisotropic etching is performed on the sacrificial material film SL as marked by arrows A. Accordingly, the sacrificial film SL' having a liner shape may be formed to the thickness "t" on the side wall of the opening OP as shown in FIG. 3B. The groove GR, through which a surface of the first electrode 20B', is exposed is defined by the sacrificial film SL'.

Referring to FIG. 3C, the variable resistive material film 30L which is to be the variable resistive layer 40 is formed on the interlayer insulating film 30 to fill the groove GR. Next as shown in FIGS. 2D through 2G, the variable resistive material film 30L is partially removed until a portion of the sacrificial film SL' is exposed, and at least one portion of the sacrificial film SL' is removed to form the gap G between the inner surface 40S1 of the interlayer insulating film 40 and the side wall 30S of the variable resistive layer 30 (see FIG. 2D). Next, the second electrode 20T (see FIG. 1A) may be formed on the variable resistive layer 30 and may be patterned if necessary. As a result, the second electrode 20T closing the gap G may be formed.

According to an exemplary embodiment, since a width of the variable resistive layer 30 in the opening OP may be reduced due to the gap G, and a programming region may be reduced, the variable resistive memory device 100B may have a high driving speed, low power consumption, and a high density of integration. Also, since a thermal conductivity between adjacent memory cells may be reduced due to the gap G, a phase-change memory device having reduced thermal interference may be provided.

Figure 4:
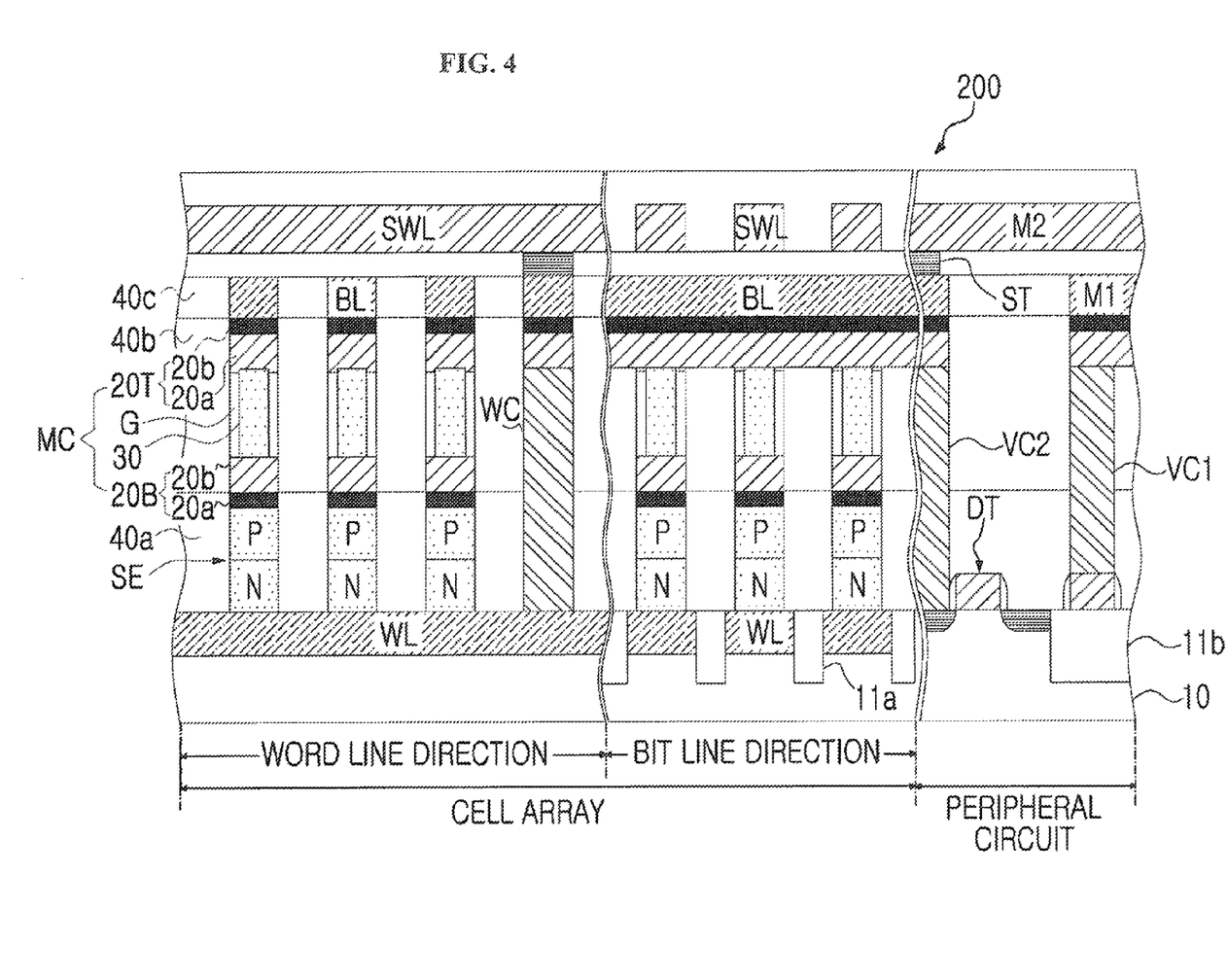
FIG. 4 is a cross-sectional view illustrating an exemplary variable resistive memory device and partially illustrating both a peripheral circuit and a cell array.

FIG. 4 is a cross-sectional view illustrating an exemplary variable resistive memory device 200. FIG. 4 is a partial cross-sectional view illustrating both a cell array and a peripheral circuit. For clear explanation of the variable resistive memory device 200, the cell array is separately shown in a word line direction (an extension direction of a word line WL) and a bit line direction (an extension direction of a bit line BL).

Referring to FIG. 4, the cell array may include a plurality of the word lines WL provided in the substrate 10. The word lines WL may be a high-concentration doped layer formed in the substrate 10. In order to form the high-concentration doped layer a first device isolating film 11a defining a word line pattern is formed in the substrate 10.

Next, an N-type or P-type high-concentration doped layer (which may become the word lines WL) may be formed using ion implantation in a portion of the substrate 10, other than the device isolation film 11a in a region of the cell array. A second device isolation film 11b defining an active region where a device such as a transistor is formed may be formed in a region of the peripheral circuit at the same time as the first isolation film 11a is formed.

Alternatively, the word lines WL may be a metal wiring pattern layer formed in the substrate 10. The metal wiring pattern layer may be formed by patterning a metal film such as aluminium, copper, tungsten, an alloy thereof, or a conductive metal oxide.

Next, a first interlayer insulating film 40a may be formed on the word lines WL. The first interlayer insulating film 40a may extend to the region of the peripheral circuit. The first interlayer insulating film 40a may be made of silicon oxide or silicon nitride formed by using, for example, high-density plasma (HDP) deposition.

Next, holes for forming a diode that will function as a selection element SE may be defined in the first interlayer insulating film 40a. Surfaces of the word lines WL may be partially exposed through the holes. Subsequently, a semiconductor layer for a diode may be formed in the holes. When the word lines WL are high-concentration doped layers, as described above, the semiconductor layer for a diode may be a single crystal layer formed by using solid phase epitaxy (SPE) or selective epitaxial growth (SEG) on the high-concentration doped layers that are partially exposed.

Alternatively, when the word lines WL are the metal wiring pattern layer, the semiconductor layer for a diode may be obtained by burying a polysilicon layer in the holes. P-type and N-type impurity regions may be formed in the semiconductor layer for a diode by performing in situ ion implantation while or after the semiconductor layer for diode deposited. The diode may then be activated by performing an appropriate thermal treatment.

Although the diode illustrated as the selection element SE is a PN junction diode, the diode is not limited thereto. Also, in order to increase a capacity of the variable resistive memory device 200, increase an ON current, or perform a multi-bit operation, a diode having rectification characteristics other than a PN junction diode may be used. For example, when the word lines WL are the metal wiring pattern layer, the diode may be a Schottky diode that is formed by a junction with the semiconductor layer for a diode. Alternatively, when the variable resistive layer 30 has bipolar switching characteristics, the diode may be a Zener diode having bidirectional rectification characteristics. Alternatively, a p-type semiconductor-intrinsic semiconductor-p-type semiconductor (p-i-n) junction diode, including an intrinsic semiconductor layer, or a p-type semiconductor-intrinsic semiconductor-metal (pim) junction diode, including a metal wiring pattern layer, may be used in the region of the cell array.

The selection element SE is provided by using the first interlayer insulating film 30a as a mold insulating film Alternatively, after a semiconductor layer that may become the selection element SE is formed on the word line WL, and a switching element is formed by patterning the semiconductor layer, the first interlayer insulating film 30a may be formed.

In the active region of the peripheral circuit, elements for driving the cell array, for example, a driving transistor DT may be provided. A source/drain and a gate of the driving transistor DT may be electrically connected by first and second via contacts VC1 and VC2 with wiring layers M1 and M2.

Referring back to the cell array, a memory cell MC may be formed on the selection element SE. The memory cell MC may be selectively separated by a second interlayer insulating film 40b. The memory cell MC may include the first electrode 20B, the second electrode 20T, and the variable resistive layer 30 for storing information between the first electrode 20B and the second electrode 20T, as described with reference to FIG. 1A or 1B, and a side wall of the variable resistive layer 30 may define the gap G by being recessed from an inner surface of an opening of the second interlayer insulating film 40b, as described with reference to FIGS. 2A through 3C.

The first electrode 20B of the memory cell MC may be a single metal layer, or may have a stacked structure including a barrier layer, an adhesion layer, or an ohmic contact layer 20a, such as a silicide layer, and a lower electrode layer 20b. The second electrode 20T of the memory cell MC may be a single metal layer, or may have a stacked structure including a barrier layer, an adhesion layer, and/or the ohmic is contact layer 20a and an upper electrode layer 20b.

The second electrode 20T is coupled to the bit lines BL. The second electrode 20T may be patterned to be parallel to an extension direction of the bit lines BL. Alternatively, the second electrode 20T may be patterned individually for each memory cell MC, like the first electrode 20B.

The bit lines BL may be formed to have a damascene structure or a dual damascene structure in a third interlayer insulating film 40c. Alternatively, the bit lines BL may be formed by using any of various wiring forming processes. The bit lines BL may be a metal wiring pattern layer formed of W, Al, or Cu. When the bit lines BL are formed of a metal which is difficult to etch such, as Cu, the bit lines BL may have the damascene structure or the dual damascene structure.

A highly integrated memory device designed to have a cross-point array structure of $4F^2$ may be provided by causing the bit lines BL to cross the word lines WL and forming a plurality of the memory cells MC at intersections between the bit lines BL and the word lines WL. In operation, an arbitrary memory cell may be addressed by selecting the bit line BL and the word line WL, the memory cell may be programmed by being biased to a predetermined voltage level, and information of a resistance value of the variable resistive film 30 of the memory cell may be read by measuring a current flowing through the bit line BL.

When there is a selection element, a bias voltage may be applied to the corresponding bit line BL and the corresponding word line WL such that a diode of a selected memory cell is reverse biased along with diodes of other non-selected memory cells. In contrast, a bias voltage may be applied to the corresponding bit line BL and the corresponding word line WL such that a diode of a selected memory cell is forward biased.

An stacked order in which the selection element SE and the memory cell MC on the selection element SE may be reversed. Also, although not shown in FIG. 4, as long as cell selectivity may be ensured, polarities of diodes SE may be reversed.

Additional circuit members may be provided over the bit lines BL. For example, a wiring, for example, a strapping word line SWL, which is electrically connected to the word lines WL through a conductive member, such as a word line contact WC, may be formed on the bit lines BL. The strapping word line SWL may be a well-known metal wiring pattern layer formed of Al or Cu.

The word line contact WC may have a structure in which conductive studs ST respectively formed for the interlayer insulating films 40a, 40b, and 40c in each cell array fabricating process are connected to one another. Since resistance of the word lines WL may be reduced due to the strapping word line SWL, the variable resistive memory device 200 may have a uniform driving speed and a uniform performance among the memory cells MC.

In the region of the peripheral circuit, a second metal wiring M2, corresponding to the strapping word line SWL, may be provided on a first metal wiring M1. The second metal wiring M2 may be connected to the driving transistor DT through the second via contact VC2.

Although the interlayer insulating films 40a, 40b, and 40c are illustrated in FIG. 4, the arrangement of the interlayer insulating films is not limited. For example, the first interlayer insulating film 40a that separates the selection element SE and the second interlayer insulating film 40b that forms the memory cells MC may be provided as a single interlayer insulating film, and at least one of the first interlayer insulating film 40a and the second interlayer insulating film 40b may have a stacked structure including a plurality of interlayer insulating films. Also, although the second electrode 20T and the bit lines BL are separately formed, the second electrode 20T may be bit lines.

Figure 5:
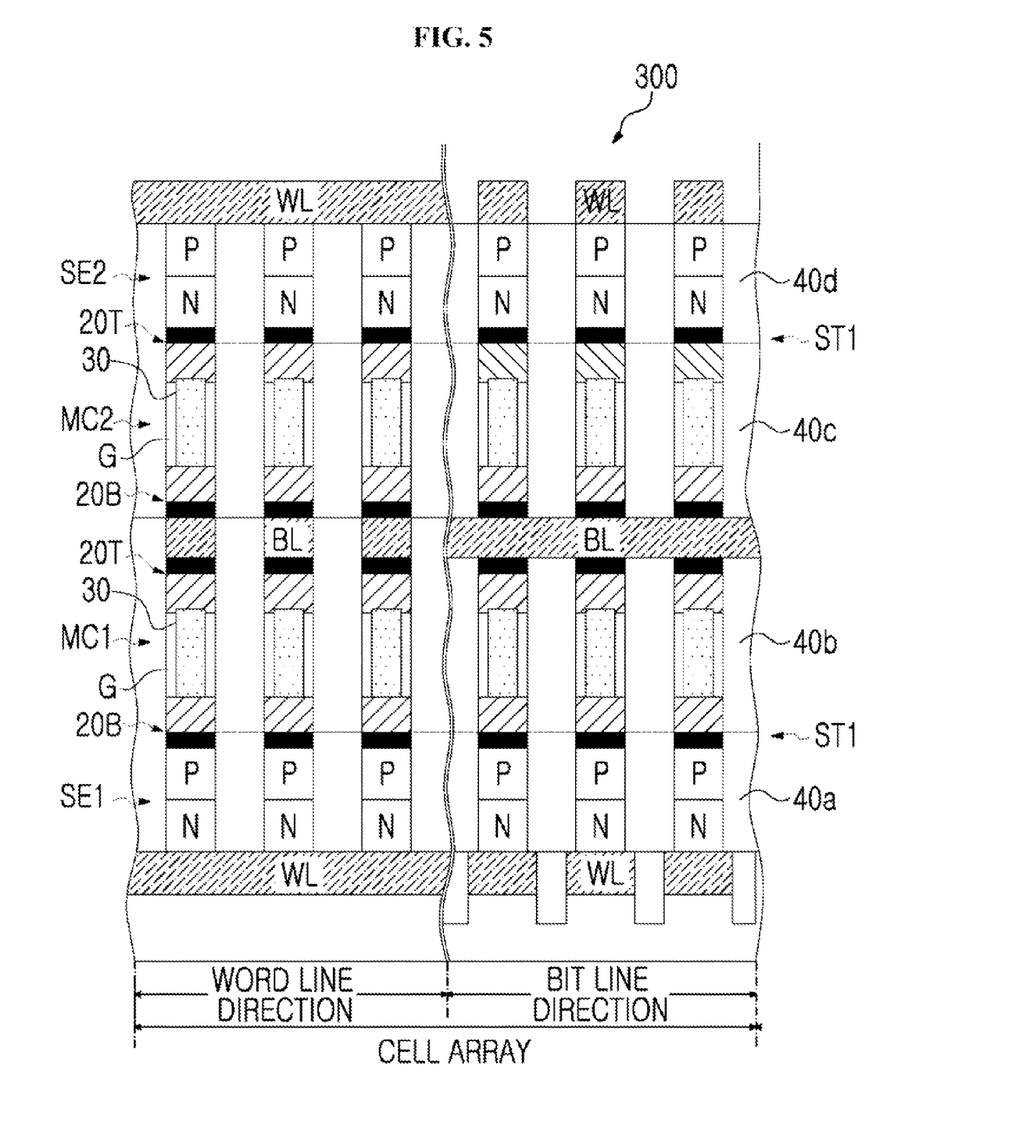
FIG. 5 is a cross-sectional view illustrating an exemplary variable resistive memory device.

FIG. 5 is a cross-sectional view illustrating an exemplary variable resistive memory device 300 according to another embodiment of the present invention. A cell array of the variable resistive memory device 300 is separately illustrated in a word line direction (an extension direction of the word line WL) and a bit line direction (an extension direction of the bit line BL). FIG. 5 only shows the cell array. The peripheral circuit previously described with respect to, FIG. 4. Also, previously denoted elements are referred to by previously indicated reference numerals. The previous descriptions may be referred to and an explanation thereof will not be given.

Referring to FIG. 5, the cell array of the variable resistive memory device 300 has a three-dimensional (3D) vertical structure in which two memory stacks ST1 and ST2 are stacked. Also, the first electrode 20B and the second electrode 20B are patterned for each memory cell.

In the variable resistive memory device 300, the first memory stack ST1 and the second memory stack ST2 may share the bit line BL as shown in FIG. 5. The 3D vertical structure may store more data in the same area.

The first memory stack ST1 and the second memory stack ST2 may respectively include memory cells MC1 and MC2 and selection elements SE1 and SE2 respectively connected to the memory cells MC1 and MC2, as shown in FIG. 5. The memory cells MC1 and MC2, including the gaps G of the first and second memory stacks ST1 and ST2, may be fabricated by using the same method (or similar methods), as described above with reference to FIGS. 2A through 3C. Although a PN junction diode is illustrated in FIG. 5, the diode not limited thereto, and other diodes such as a Schottky diode may be used.

Although an order in which the selection element SE1 and the memory cell M1 of the first stack ST1 are stacked and an order in which the selection element SE2 and the memory cell MC2 of the second stack ST2 are stacked are opposite to each other in FIG. 5, the orders may be reversed or the orders may be the same. Also, although not shown in FIG. 5, as long as cell selectivity may be ensured, polarities of diodes may be reversed.

The characteristics and advantages described with reference to the drawings are compatible and thus may be replaced or combined unless clearly contradicted, and such modifications are also within the scope of the present invention. For example, an order in which the selection element SE2 and the memory cell MC2 of the second stack ST2 are stacked and/or characteristics of the first and second electrodes 20B and 20T may apply to the variable resistive memory device 200 of a single layer of FIG. 4.

Also, various variable resistive memory devices described with reference to the drawings may be realized as single memory devices or as a system-on-chip (SOC) integrated with other devices, such as a logic processor, an image sensor, or a radio frequency (RF) device. Also, a wafer chip, on which a variable resistive memory device is formed, may be attached to another wafer chip, on which a different type of device is formed, by using an adhesive, soldering, or wafer bonding, and a resultant structure may be individualized as a single chip.

Also, variable resistive memory devices according to the embodiments may be realized as any of various semiconductor packages. For example, the variable resistive memory devices may be packaged by package-on-package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small Outline (SOIC), shrink small outline package (SSOP), thin small outline (TSOP), thin quad flatpack (TQFP), system in package (SIP), multi chip package (MCP), wafer-level fabricated package (WFP), or wafer-level processed stack package (WSP). A package, on which exemplary variable resistive memory devices are mounted may further include a controller or a logic device for controlling the package.

Figure 6:
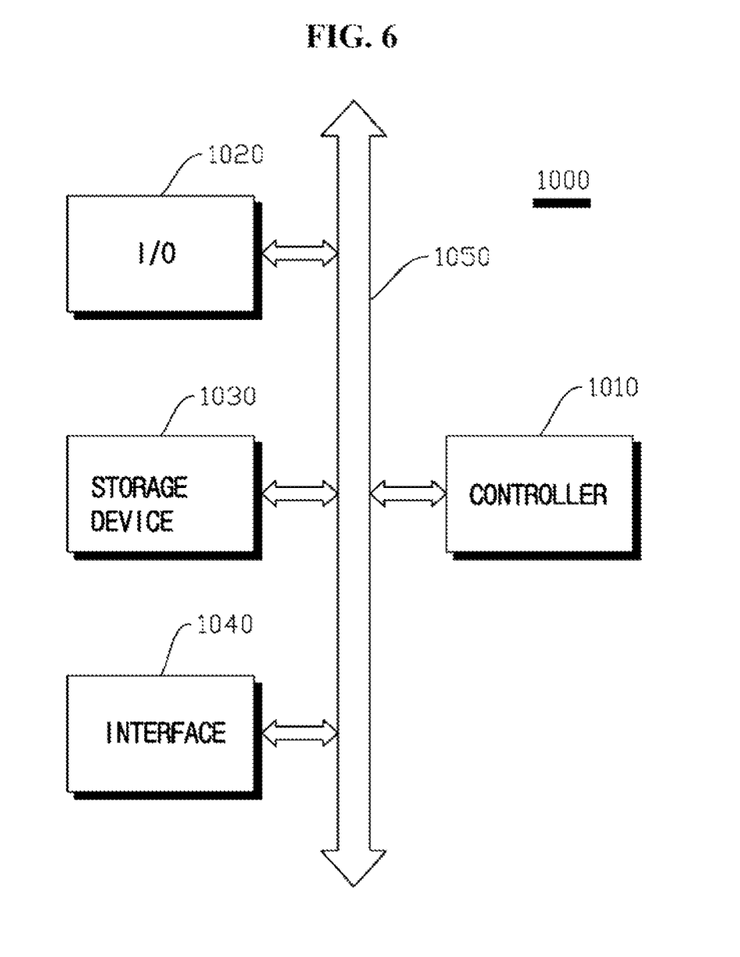
FIG. 6 is a block diagram illustrating an exemplary electronic system including variable resistive memory devices.

FIG. 6 is a block diagram illustrating an electronic system 1000 including exemplary variable resistive memory devices.

Referring to FIG. 6, the electronic system 1000 may include a controller 1010, an input/output (I/O) device 1020, a storage device 1030, an interface 1040, and a bus 1050. The controller 1010, the I/O device 1020, the storage device 1030, and/or the interface 1040 may be coupled to one another via the bus 1050.

The controller 1010 may include at least one of a microprocessor, a digital signal processor, a micro controller, and any of logic devices that may perform a similar function to that thereof. The I/O device 1020 may include a keypad, a keyboard, or a display device. The storage device 1030 may store data and/or commands, and may include variable resistive memory devices disclosed herein.

The storage device 1030 may have a mixed structure further including another type of semiconductor device (for example, a dynamic random access (DRAM) device and/or an embedded static random access memory (ESRAM) device). The interface 1040 may transmit or receive data to or from a communication network. The interface 1040 may be a wired or wireless interface. To this end, the interface 1040 may include an antenna or a wired/wireless transceiver. Although not shown in FIG. 6, the electronic system 1000 which is an operation memory for improving an operation of the controller 1010 may further include a high-speed DRAM and/or ESRAM.

The electronic system 1000 may be applied to a personal digital assistant (PDA), a portable computer, a tablet PC, a wireless phone, a mobile phone, a digital music player, a memory card, or any electronic device that may wirelessly transmit or receive information.

According to the embodiments of the present invention, since a gap is formed when a side wall of a variable resistive layer is recessed from an inner surface of an opening of an interlayer insulating film, a width of the variable resistive layer in the opening may be reduced, a programming region of the variable resistive layer may be reduced, a driving speed may be increased, and power consumption may be reduced. Also, a contact area between an electrode and the variable resistive layer may be reduced due to the gap. As a result, when the variable resistive layer is formed of a phase-change material and the gap is evacuated or filled with an appropriate gas, since a thermal conductivity of the gap is lower than a thermal conductivity of the interlayer insulating film which is an adjacent solid state film, thermal interface in which heat generated during programming of a selected memory cell is transferred to another adjacent memory cell and the adjacent memory cell is programmed may be reduced or prevented, thereby providing a variable resistive memory device with improved reliability.

Since the gap having the above advantages may be easily formed by forming a sacrificial film and selectively removing the sacrificial film, a method of fabricating a variable resistive memory device with high reliability and low costs may be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a variable resistive memory device, the method comprising:
    forming an interlayer insulating film, the interlayer insulating film having an opening therein, the opening exposing a surface of a first electrode which is disposed at a bottom of the opening;
    forming a sacrificial film on an inner side surface of the opening, the sacrificial film defining a groove through which a surface of the first electrode is exposed;
    filling the groove with a variable resistive material;
    forming a variable resistive layer by removing the variable resistive material film to expose the sacrificial film;
    removing the sacrificial film to form a gap between the inner side surface of the opening and a sidewall of the variable resistive layer; and
    forming a second electrode on the variable resistive layer.

2. The method of claim 1, wherein the forming of the sacrificial film comprises:
    filling the opening with a sacrificial layer; and
    anisotropically etching the sacrificial layer to form the sacrificial film having a spacer shape on the inner side surface of the opening.

3. The method of claim 1, wherein the forming of the sacrificial film comprises:
    conformally forming, to a uniform thickness, a sacrificial layer on the inner side surface of the opening and on the exposed surface of the first electrode; and
    etching the sacrificial layer to form the sacrificial having a liner shape on the inner side surface of the opening.

4. The method of claim 1, wherein the removing the sacrificial film further comprises:
    removing the sacrificial film by wet etching.

5. The method of claim 1, wherein the removing the variable resistive material further comprises:
    removing the variable resistive material film by planarization or etchback.

6. The method of claim 1, wherein the sacrificial has a higher etch rate than that of the interlayer insulating film.

7. The method of claim 1, wherein the interlayer insulating film comprises a silicon oxide film, and the sacrificial film comprises a silicon nitride film, a silicon oxynitride film, or a combination thereof.

8. The method of claim 1, wherein the first electrode is formed at the bottom of the opening.

9. The method of claim 1, wherein the forming of a second electrode comprises:
    forming the second electrode using physical vapor deposition.

10. The method of claim 1, wherein the second electrode is patterned to extend over an outer surface of the interlayer insulating film to cover the gap.

11. The method of claim 1, further comprising:
    filling the gap with oxygen, nitrogen, an inert gas, or a mixture thereof.

12. The method of claim 1, further comprising:
    evacuating the gap.

13. The method of claim 1, wherein the variable resistive layer comprises a phase-change material layer.

14. The method of claim 13, wherein the phase-change material layer comprises a chalcogenide material.

* * * * *